United States Patent [19]

Kurumisawa

[11] Patent Number: 5,185,225
[45] Date of Patent: Feb. 9, 1993

[54] LETTERPRESS FOR TRANSFERRING AND METHOD OF TRANSFERRING BY USE OF THE LETTERPRESS FOR TRANSFERRING

[76] Inventor: Kuninobu Kurumisawa, No. 741-1, Washisu, Oaza, Sugito-cho, Kitakatushika-gun, Saitama-ken, Japan

[21] Appl. No.: 605,376

[22] Filed: Oct. 30, 1990

[30] Foreign Application Priority Data

May 29, 1990 [JP] Japan .................. 2-139055
Jul. 5, 1990 [JP] Japan .................. 2-178627

[51] Int. Cl.⁵ .............................. G03C 3/00
[52] U.S. Cl. .............................. 430/18; 430/9; 430/300; 430/306
[58] Field of Search ............... 430/18, 9, 300, 306

[56] References Cited

U.S. PATENT DOCUMENTS

| | | | |
|---|---|---|---|
| 3,865,588 | 2/1975 | Ohto et al. | 430/18 |
| 4,019,904 | 4/1977 | Noshiro et al. | 430/18 |
| 4,079,159 | 3/1978 | Sano et al. | 430/18 |
| 4,268,611 | 5/1981 | Okishi et al. | 430/300 |
| 4,369,246 | 1/1983 | Chen et al. | 430/300 |

Primary Examiner—Marion E. McCamish
Assistant Examiner—Mark A. Chapman
Attorney, Agent, or Firm—Keck, Mahin & Cate

[57] ABSTRACT

The present invention relates to a letterpress for transferring on which a dot-like fine form plate surface is formed closely resembling a photoimage, and to a method of transferring by use of the letterpress for transferring. The letterpress is formed by exposing a photosensitive resin through a photofilm to a parallel light to harden the film of the photosensitive resin corresponding to the lightscreening area of the photofilm. The area of the photo resin other than the hardened film is then removed by rinsing with water to form the letterpress which has a convex corresponding to the light-penetrating area of the photofilm. The convex is then directly coated with various dyes and press printed on and transferred to a transfer material, or the convex is coated with a photosensitive resin and press printed on a transfer material. The photosensitive resin film transferred is then exposed to light and a non-light exposure area is rinsed with water, thereby allowing the material to be applied as a resistant mask for dyeing or blast processing.

13 Claims, 4 Drawing Sheets

LETTERPRESS FOR TRANSFERRING AND METHOD OF TRANSFERRING BY USE OF THE LETTERPRESS FOR TRANSFERRING

FIELD OF THE INVENTION

The present invention relates to a letterpress for transferring on which a dot-like fine form plate surface is formed closely resembling a photoimage, and to a method of transferring such a plate image by dyeing and printing using the letterpress for transferring.

DESCRIPTION OF BACKGROUND ART

In dyeing methods, conventionally, various techniques have been employed such as hand-drawing dyeing, batik using wax as a dyeing preventive material, and paste pattern dyeing using paste as a dyeing preventive material.

For example, batik using wax as a dyeing preventive material is based on a technique by which a pattern is formed to produce a dyed material using wax melted through a paintbrush, brush or pattern and dyeing the material using the wax pattern formed as a dyeing preventive material, and then the wax is removed leaving a pattern where the wax covered the material. Paste pattern dyeing is based on a technique by which a dyed material is coated with a paste for preventing dyeing and after the paste coating has dried the material is dyed and then rinsed with water to remove the paste.

However, dyeing techniques using handwork, as described above, require great skill on which the workmanship of the dyeing depends, and all such techniques have a limit in terms of the accuracy of the pattern depicted. Considerable time and labor are required to remove the wax preventing dyeing in certain areas, for the paste to dry and to rinse with water.

Also the blast processing technique, by which particles such as river sand and silica sand are injected with compressed air and blasted on to a work, has been conventionally used only for surface processing such as sand-removal of casts and debarring, and letter-engraving of gravestone and the like.

However, conventionally, there is not a technology using blast processing of a work surface to engrave the surface with a fine shape or letter or to carve a deep hole like a pot to perform technological engraving.

The reason is that conventional masks were produced in a primitive manner wherein a rubber plate is cut out by a cut knife, so that it is difficult to produce a fine mask, and the mask, adhering to an engraved surface, is easily teared off or turned up by injection pressure. If a mask is allowed to closely adhere to the engraved surface using an adhesive to prevent such trouble, tearing up becomes difficult.

DISCLOSURE OF THE INVENTION

An object of the present invention, which has been devised considering the circumstances in dyeing techniques and the blast processing technique as described above, is to provide a method for producing a dot-like fine letterpress for transferring a design closely following a photoimage and for producing a resistant mask suitable for dyeing or blast processing using the letterpress.

A further object of the present invention is to provide a letterpress capable of producing a resistant mask capable of blast engraving any number of times required.

A further object of the present invention, which has been devised to eliminate an inconvenience that prior art methods of transferring letterpress allows only a convex surface of a letterpress to be transferred, and the transferring of a concave image requires the reversing of an original manuscript film to start, is to provide a method of transferring using a letterpress on which a dot-like fine form plate surface is formed closely following a photoimage in which the transferring of the image on the concave side of the letterpress can be performed.

In order to achieve such objects, the letterpress for transferring according to the present invention is characterized in that a photosensitive resin layer is formed through a non-adhesive protective film on a manuscript film, a supporting substrate coated with an adhesive is pressure bonded on the resin layer in such a manner that the adhesive is opposite to the resin layer, a parallel light is irradiated through the manuscript film to the resin layer to be exposed for a given time to form a hard area on the surface exposed to the light which hard area corresponds to the image of the manuscript film on the resin layer, and the non-adhesive protective film is teared off and the resin layer other than the hard area is rinsed with water and removed to form a letterpress corresponding to the image of the manuscript film on the supporting substrate.

Also, where the letterpress described above is used for dyeing technique, it is characterized in that a photosensitive resin layer is exposed to light through a manuscript film to coat the convex surface of a letterpress for transferring formed on a supporting substrate with a fluid photosensitive resin, the letterpress is press printed on a transfer material, thereby causing the material to be coated with the photosensitive resin, the transferred photosensitive resin is exposed to light and hardened, then using the photosensitive resin film as a mask a required coloring is performed on the transfer material, and thereafter the photosensitive resin transferred to the transfer material is rinsed with water and removed to transfer the concave of the letterpress.

Further, where the letterpress described above is used for blast processing technique, it is characterized in that a photosensitive resin layer is exposed to light through a manuscript film to coat a convex of a letterpress formed on a supporting substrate with a photosensitive resin containing a non-photosensitive adhesive mass, the letterpress is press printed on an engraved surface, thereby causing the convex to be coated with the photosensitive resin, and the resin is exposed to light to form a resistant mask for blast engraving.

DETAILED DESCRIPTION OF THE INVENTION

With reference to drawings, embodiments according to the present invention will be explained hereinafter.

First, with reference to FIG. 1 (A) through (I), a method of fabricating a letterpress will be explained.

Figure 1:
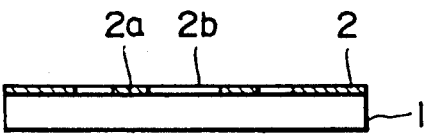
FIG. 1 (A) through (I) are typical sectional views showing a method of fabricating a letterpress according to the present invention.
Figure 1:
Figure 1:
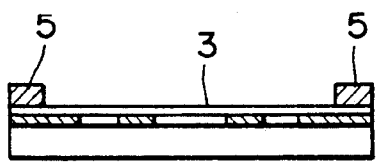
Figure 1:
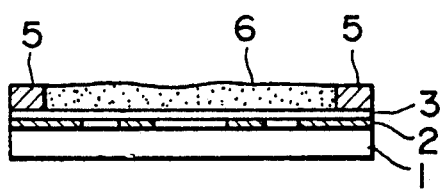
Figure 1:
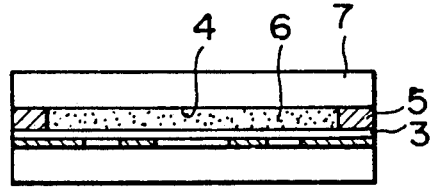
Figure 1:
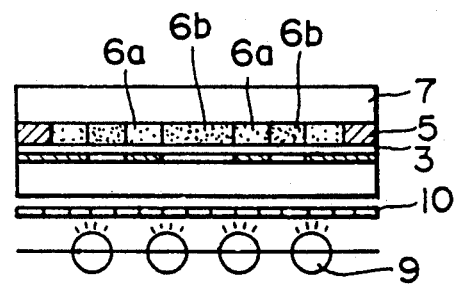
Figure 1:
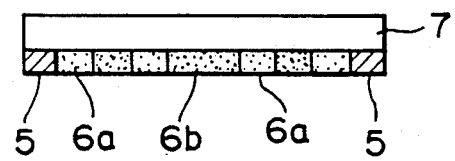
Figure 1:
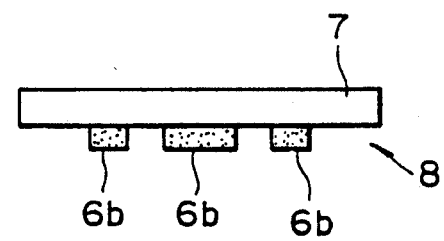
Figure 1:
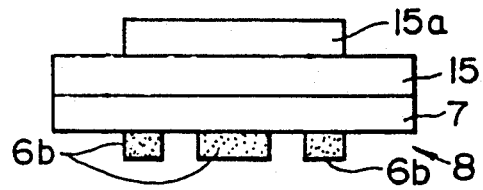

A manuscript film 2 is placed on a light-exposure glass 1 in a light-exposure device (not shown) (FIG. 1 (A)). The film has been photodeveloped with an image by which a shape on the film required to be transferred is set to a light-penetrating area 2b and an area of the film not to be transferred is set to a light-screening area 2a. A non-adhesive film 3 of polypropylene film (or polyester film may be used) with a thickness of approximately 0.2 mm is placed on the manuscript film 2 (FIG. 1 (B)).

Then, banks 5 are formed on the outer periphery of the non-adhesive film 3 using an adhesive tape. The banks have a thickness of approximately 3 to 5 mm (FIG. 1 (C)), and a fluid photosensitive nylon resin is poured between the banks 5 to form a photosensitive resin layer 6 (FIG. 1 (D)). At this time, the manuscript film 2 is protected from the photosensitive resin layer 6 by the non-adhesive film 3.

Then, a supporting substrate 7 is placed on the photosensitive resin layer 6, during such placement one side of the supporting substrate 7 is coated with an adhesive 4, and with the side coated with the adhesive 4 being opposite to the photosensitive resin layer 6, the supporting substrate 7 is pressed, thereby causing the photosensitive resin layer 6 to be flattened to a given thickness and causing the supporting substrate 7 to adhere to the photosensitive resin layer 6 (FIG. 1 (E)).

Also, if the supporting substrate 7 is composed of either a plate material made of a light-penetrating resin, a plate material painted black, or a plate material covered with a halation preventive agent, a highly accurate photosensitive processing can be performed without developing halation during actual light exposure.

Then, with the periphery of a light-exposure device being kept in darkroom conditions (not shown), the light from a light source 9, such as a halogen lamp or a mercury lamp, is corrected through parallel light correction means 10 to a parallel light for exposure of the device from the under side of the exposure glass 1, and the photosensitive resin 6 is exposed through the manuscript film 2, to the parallel straight-going light for 20 to 30 seconds (FIG. 1 (F)).

By such method of exposure to light, the light does not hit the photosensitive resin layer 6 diagonally, thereby causing the exposure to closely follow the image of the manuscript film 2, with the result that only an exposure area 6b corresponding to the light-penetrating area 2a of the manuscript film 2 is exposed to light and hardened.

Then, the non-adhesive film 3, the bank 5, the photosensitive resin layer 6, and the supporting substrate 7 on the manuscript film 2 are all taken out from the light-exposure device, and the non-adhesive film 3 is teared off (FIG. 1 (G)). The non-adhesive film 3, being non-adhesive, is easily teared off the resin layer 6. Thus, when the whole of the photosensitive resin layer 6 is exposed and rinsed with water or hot water, or a solvent of water or hot water containing a 3 percent caustic soda, a non-light exposure area 6a keeping an original fluid resin property is easily removed, and only a light-exposure area (hard area) 6b remains adhering to the supporting substrate 7 to form a letterpress 8 as shown (FIG. 1 (H)).

Then, in order to make convenient the use of the letterpress thus fabricated, a holding plate 15 with a holding part 15a is fixed on the supporting substrate 7 (FIG. 1 (I)).

Using FIG. 2 (A) through (F), an example where the letterpress described above is used for a dyeing technique will be explained hereinafter.

Figure 2:
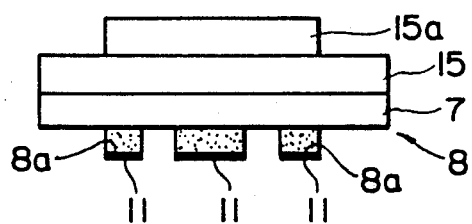
FIG. 2 (A) through (F) are typical sectional views where the letterpress of FIG. 1 is used for a dyeing technique causing a relationship of positive to negative or negative to positive.
Figure 2:
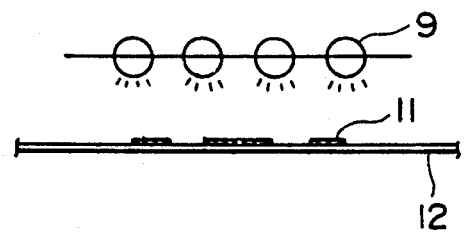
Figure 2:
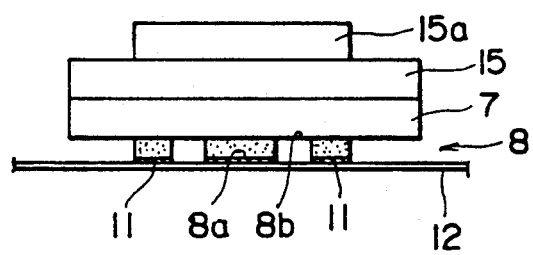
Figure 2:
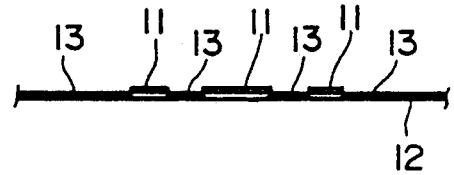
Figure 2:
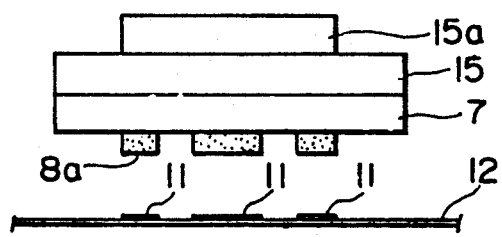
Figure 2:
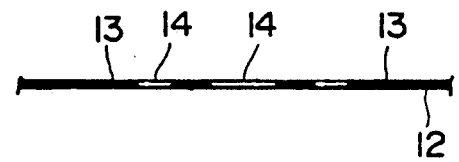

A convex 8a of the letterpress 8, fabricated as described above, is coated with a fluid photosensitive resin 11 (FIG. 2 (A)), and the convex 8a is press printed on a transfer material 12 such as various dyed fabrics to transfer and fix the photosensitive resin 11 (FIG. 2 (B)).

The convex 8a of the letterpress 8 has a shape corresponding to the dot-like image of the manuscript film from the fabrication method described above, thereby causing the dot-like image of the manuscript film to be transferred to the transfer material 12 by the photosensitive resin 11 (FIG. 2 (C)).

Then, when the light from a light source 9 is irradiated on the photosensitive resin film 11 transferred to the transfer material 12, the photosensitive resin film 11 transferred is fixed and hardens in a short time of approximately 20 to 30 seconds, adhering to the transfer material 12 (FIG. 2 (D)). However, it is not required to use parallel light for this step of light exposure as described above, and using a light source 9 such as a halogen lamp, direct irradiation may be applied to the transfer material 12. The hardening of the photosensitive resin film 11 occurs in a very short time unlike the drying of conventional dyeing preventive paste.

Then, by an ordinary method, the transfer material 12 is allowed to be coated with a required dye 13. At this time the photosensitive resin film 11 is hardened and adhering to the transfer material 12 and functions as a resistant mask (FIG. 2 (E)).

Also, if, before the coating with the dye 13, various dyed fabric materials used as the transfer material 12 have been sized, no bleeding of the dye 13 will develop on the transfer material 12, thereby allowing the fine transferring of a dot-like image to be performed with high accuracy.

Then, after the dye 13 has hardened the transfer material 12 is rinsed with water, the photosensitive resin film 11 being a mask for resisting the dye is removed to become a non-dyed area 14 (corresponding to the convex 8a of the letterpress 8), thereby allowing the transfer material 12 in which the area coated with the dye 13 is made an image corresponding to the concave 8b of the letterpress 8 to be obtained (FIG. 2 (F)).

Having described a dyeing technique for dyed fabric materials in the above embodiments, the technique is not limited to fabric, and can be applied to various printing of paper, plastic and metal.

According to the transferring technique, by the manuscript film 2, the convex 8a of the letterpress 8 can be formed in a dot-like shape, and the dot-like form plate surface be transferred, thereby allowing a very fine image entirely different from the conventional dyeing preventive material by handwriting or stencil to be transferred, and also by shading according to the density of the dot transferred, a dyed picture can be made three-dimensional.

Also, in the prior art method of transferring letterpress, only the convex 8a can be transferred (positive to positive, or negative to negative), and the transferring of the concave 8b must be performed by reversing the image of an original manuscript film. This causes the expensive manuscript film to be consumed unavoidably. According to the present invention, the transferring (negative to positive, or positive to negative) of the concave 8b using the same letterpress 8 is performed in such a manner that the convex 8a of the letterpress 8 is coated with the photosensitive resin film 11, as described above, and the film is used as a mask for resisting the dye and colored, thereby causing the transferring of the area other than the mask, that is, transferring the concave 8b, to be performed.

Figure 3:
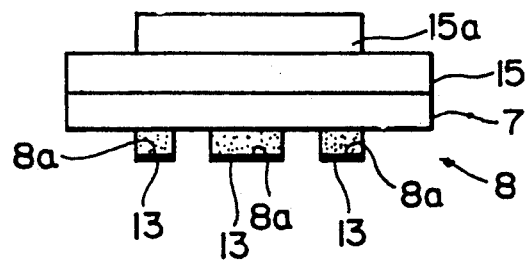
FIG. 3 (A) through (C) are typical sectional views where the letterpress of FIG. 1 is used for a dyeing technique causing a relationship of negative to negative or positive to positive.
Figure 3:
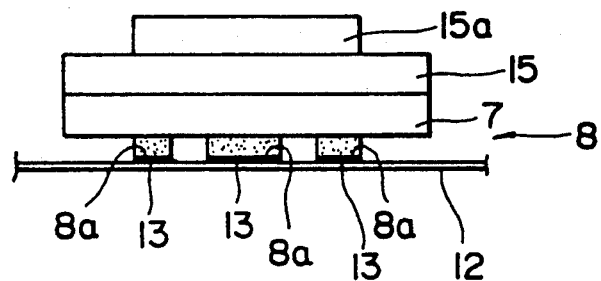
Figure 3:
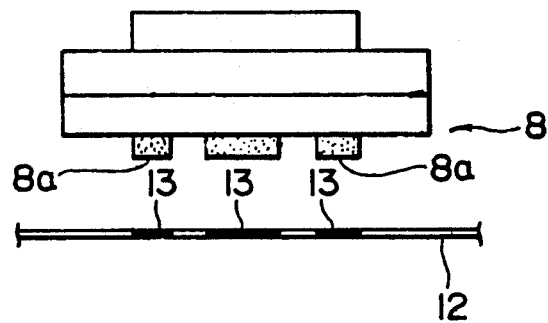

However, using the letterpress according to the present invention, the transferring of positive to positive, or negative to negative, that is, that of the convex 8a, can of course be performed. In this case, as shown in FIG. 3 (A) through (C), using the letterpress for transferring 8 obtained in FIG. 1 (H), its convex 8a is directly coated with the proper various dye 13, and press printed on transfer material 12 such as fabric, paper or metal, thereby allowing the dye 13 having adhered to the convex 8a to be colored on and transferred to the transfer material 12. Also, by the dyeing technique, similarly to the above, the transferring of a dot-like fine image corresponding to the manuscript film 2, as well as the transferring of a three-dimensional image can be performed.

Also, even when either of the dyeing techniques shown in FIGS. 2 and 3 is used, the high skill required in prior art dyeing techniques is made unnecessary, the labor required is reduced and the workhours are shortened, thereby allowing a fine transferrance which had been conventionally unrealizable.

Further, the letterpress for transferring according to the present invention used in those dyeing techniques can be handled as a one-piece device, so that its storage and conveyance can be freely performed, and once the letterpress has been formed, many transferrings can be performed any number of times required, thereby making unnecessary the fabrication of dyeing preventive patterns in prior art dyeing techniques, and possible the coloring by simple means with a very low cost.

Using FIG. 4 (A) through (F), an example where the letterpress described above is used for a blast processing technique will be explained hereinafter.

A fluid photosensitive resin, preferably a photosensitive resin material having the same property as that of the material used for forming the resin layer 6 for better adhesion to the convex 8a, is used for the convex 8a of the letterpress 8, fabricated as described above. The form plate surface of the letterpress is coated with a resin containing a non-photosensitive adhesive mass, for example, a proper amount of polyvinyl acetate emulsion (FIG. 4 (A)), and then the convex 8a is press printed on an engraved surface 16a of a transfer material 16 such as stone or glass material to transfer a photosensitive resin 11a to the engraving surface (FIG. 4 (B)). The convex 8a of the letterpress has a shape corresponding to the image of the manuscript film by the fabricating method described above, so that the image of the manuscript film is transferred as the photosensitive resin film 11a to the engraved surface 16a (FIG. 4 (C)).

Figure 4:
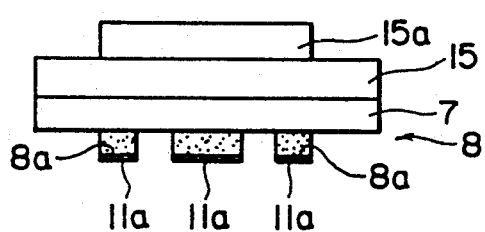
FIG. 4 (A) through (F) are typical sectional views where the letterpress of FIG. 1 is used for a blast processing technique.
Figure 4:
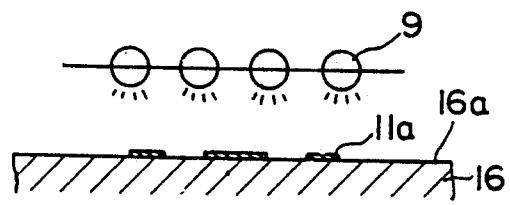
Figure 4:
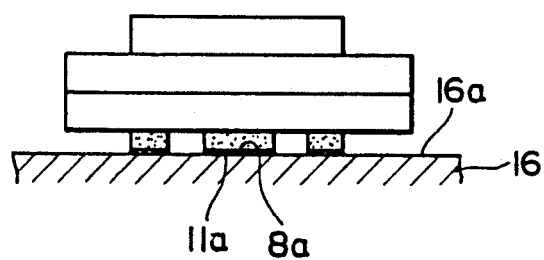
Figure 4:
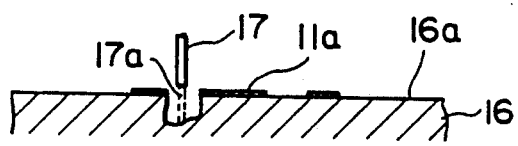
Figure 4:
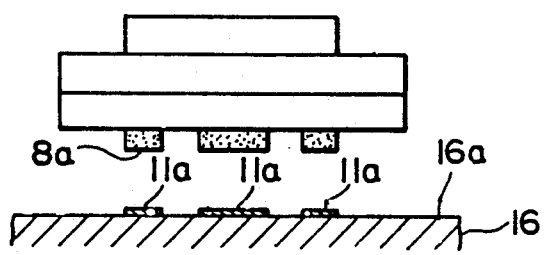
Figure 4:
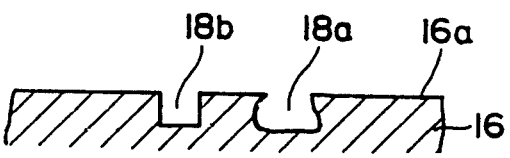

Then, when the photosensitive resin film 11a transferred to the engraved surface 16a is exposed to the light from the light source 9 such as a halogen lamp, the film hardens, as it is the transferred image, to adhere to the engraved surface 16a (FIG. 4 (D)).

Also, the polyvinyl acetate emulsion contained as a non-photosensitive adhesive mass in the photosensitive resin film 11a will not harden within the photosensitive resin film 11a hardened by light exposure, keep adhesion and give a proper flexibility, whereby when transferred to the engraved surface 16a the emulsion adheres sufficiently to the engraved surface 16a, and allows the photosensitive resin film 11a after usage to be easily teared off.

Also, the flexibility of the photosensitive resin film 11a allows itself to be sufficiently transferred to and closely adhere to a curve or irregular engraved surface as well as a plane engraved surface.

After a resistant mask made of the photosensitive resin film 11a has been formed on the engraved surface 16a, as described above, a blasting machine (not shown), arranged so as to blast high-pressure injecting particles, is used to blast ceramic particles 17a from its nozzle 17 to the exposed area or the engraved surface 16a to blast engrave the area in a required shape (FIG. 4 (E)).

By the blast engraving, regardless of the material of the engraved material 16, the adjustment of the injection angle and pressure of the nozzle 17 allows two types of engraving sectional shapes 18a (boring machining) and 18b (vertical engraving of deep hole), and the engraved hole and shape can be formed of an optional depth.

In the method of transferring, if a proper amount of a non-photosensitive adhesive mass is contained in the photosensitive resin film 11a transferred to the engraved surface 16a, the form plate surface has proper flexibility, so that even if the engraved surface 16a is a curved or irregular surface like a stone material, the photosensitive resin film 11a satisfactorily and closely adheres to the engraved surface 16a to sufficiently resist the blast injection pressure, is easily teared off after usage, and exerts an optimum property as a resistant mask for blast engraving.

Also, the letterpress for transferring according to the present invention can be handled as a one-piece device, so that its storage and conveyance can be freely performed, and once the letterpress has been formed, many transferrings can be performed any number of times as required, thereby allowing the labor of troublesome mask fabrication to be saved, and accurate blast engraving processing by very low cost and simple means.

Having described preferred embodiments according to the present invention, various changes and modifications which achieve the object of the present invention and can be made. The present invention intends to cover all such changes and modifications which come within the limitations of the present invention.

What is claimed is:

1. A letterpress for transferring an image to a surface produced by a process comprising the steps of:
   placing a manuscript film on a top side of a light exposure glass;
   placing a non-adhesive film on the manuscript film on a side opposite to the light exposure glass;
   forming banks on an outer periphery of the non-adhesive film;
   pouring a fluid photosensitive nylon resin between the banks;
   coating a supporting substrate with an adhesive;
   placing the supporting substrate in contact with the resin such that the adhesive is between the substrate and the resin;
   applying light through a parallel light correction means to an underside of the glass;

exposing the resin to the light through the manuscript film to harden the resin in areas exposed to the light;

removing the non-adhesive film, manuscript film and glass; and rinsing the resin to remove non-hardened areas of the resin.

2. A letterpress as claimed in claim 1, further comprising the step of fixing a holding plate on the supporting substrate on a side opposite the hardened resin.

3. A letterpress as claimed in claim 1, wherein the banks are formed form adhesive tape.

4. A letterpress as claimed in claim 1, wherein the light is applied for 20-30 seconds.

5. A letterpress as claimed in claim 1, wherein the light is supplied form a plurality of light sources.

6. A letterpress as claimed in claim 5, wherein the plurality of light sources are halogen lamps.

7. A letterpress as claimed in claim 5, wherein the plurality of light sources are mercury lamps.

8. A letterpress as claimed in claim 1, wherein a fluid photosensitive resin is applied to the hardened resin for producing an image on the surface.

9. A method of producing a letterpress for transferring an image to a surface comprising the steps of:

placing a manuscript film on a top side of a light exposure glass;

placing a non-adhesive film on the manuscript film on a side opposite to the light exposure glass;

forming banks on an outer periphery of the non-adhesive film;

pouring a fluid photosensitive nylon resin between the banks;

coating a supporting substrate with an adhesive;

placing the supporting substrate in contact with the resin such that the adhesive is between the substrate and the resin;

applying light through a parallel light correction means to an underside of the glass;

exposing the resin to the light through the manuscript film to harden the resin in areas exposed to the light;

removing the non-adhesive film, manuscript film and glass; and rinsing the resin to remove non-hardened areas of the resin.

10. A process as claimed in claim 9, further comprising the step of fixing a holding plate on the supporting substrate on a side opposite the hardened resin.

11. A process as claimed in claim 9, wherein the light is applied for 20-30 seconds.

12. A process as claimed in claim 9, wherein the light is supplied form a plurality of light sources.

13. A process as claimed in claim 9, further comprising the steps of applying a fluid photosensitive resin to the hardened resin for producing an image on the surface.

* * * * *